US008598920B2

(12) United States Patent
Nakatake et al.

(10) Patent No.: US 8,598,920 B2
(45) Date of Patent: Dec. 3, 2013

(54) GATE DRIVING CIRCUIT

(75) Inventors: Hiroshi Nakatake, Tokyo (JP); Shinichi Kinouchi, Tokyo (JP); Tatsuya Kitamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/260,069

(22) PCT Filed: May 7, 2010

(86) PCT No.: PCT/JP2010/003128
§ 371 (c)(1),
(2), (4) Date: Sep. 23, 2011

(87) PCT Pub. No.: WO2010/134276
PCT Pub. Date: Nov. 25, 2010

(65) Prior Publication Data
US 2012/0013371 A1    Jan. 19, 2012

(30) Foreign Application Priority Data
May 19, 2009   (JP) .................................. 2009-120802

(51) Int. Cl.
*H03K 3/00*    (2006.01)

(52) U.S. Cl.
USPC ............ 327/109; 327/434; 327/180; 327/309

(58) Field of Classification Search
USPC ......... 327/109, 306, 312, 380, 112, 108, 110, 327/111, 180; 323/276; 257/77
See application file for complete search history.

(56) References Cited

U.S. PATENT DOCUMENTS 4,808,853 A * 2/1989 Taylor .............................. 326/57
5,402,020 A * 3/1995 Yamakawa ..................... 327/312
(Continued)

FOREIGN PATENT DOCUMENTS

JP    11 55936    2/1999
JP    2005 45590  2/2005
(Continued)

OTHER PUBLICATIONS

Ralph McArthur, "Making Use of Gate Charge Information in MOSFET and IGBT Data Sheets", Oct. 31, 2001, Advanced Power Technology.*

(Continued)

*Primary Examiner* — Lincoln Donovan
*Assistant Examiner* — Thomas Skibinski
(74) *Attorney, Agent, or Firm* — Oblon, Spivak, McClelland, Maier & Neustadt, L.L.P.

(57) ABSTRACT

A gate driving circuit for driving a voltage-driven switching device is provided with a current limiting circuit for limiting a gate current ig that flows into a gate terminal through a gate resistor at turn-on to a current limit value IL which defines an upper limit value. The current limit value IL is set at a value which is larger than a gate current value I2 at turn-on of the switching device during a period when the Miller effect occurs but is smaller than a gate current value I1 at a point in time when a main current begins to flow at turn-on in a case where the gate current ig is not limited by the current limiting circuit. This arrangement makes a variation in a collector current of the switching device moderate at turn-on thereof when the collector current begins to flow, thereby reducing high-frequency noise.

6 Claims, 7 Drawing Sheets

(56) References Cited

U.S. PATENT DOCUMENTS

| | | |
|---|---|---|
| 7,151,401 B2 | 12/2006 | Inoue |
| 7,737,761 B2 | 6/2010 | Ishikawa et al. |
| 2009/0002054 A1 | 1/2009 | Tsunoda et al. |
| 2010/0213989 A1* | 8/2010 | Nakatake et al. ............. 327/109 |

FOREIGN PATENT DOCUMENTS

| | | |
|---|---|---|
| JP | 2008 92663 | 4/2008 |
| JP | 2009 11049 | 1/2009 |
| WO | WO 2009044602 A1 * | 4/2009 |

OTHER PUBLICATIONS

U.S. Appl. No. 13/390,721, filed Feb. 16, 2012, Kitamura, et al.

International Search Report issued Jul. 27, 2010 in PCT/JP10/003128 filed May 7, 2010.

* cited by examiner (a)

(b)

GATE DRIVING CIRCUIT

TECHNICAL FIELD

The present invention relates to a gate driving circuit for driving a voltage-driven power semiconductor switching device.

BACKGROUND ART

A conventional gate driving circuit is a switching circuit employing an insulated-gate bipolar transistor (IGBT) provided with a parallel-connected silicon carbide (SiC) diode which operates at a small recovery current. The gate driving circuit detects a gate voltage and a collector voltage of the IGBT and varies a gate driving voltage in several steps in order to reduce noise caused by ringing, for instance, while suppressing device loss at turn-on and diode loss at recovery (refer to Patent Document 1, for example).

PRIOR ART DOCUMENT

Patent Document

Patent Document 1: Japanese Laid-open Patent Application No. 2008-92663

SUMMARY OF THE INVENTION

Problems to be Solved by the Invention

In this kind of gate driving circuit, a gate-emitter capacitance of the IGBT configured with a capacitive component is charged at a constant voltage through a gate resistance at turn-on. Therefore, a variation in the gate voltage that occurs when the gate voltage exceeds a gate threshold voltage becomes sharper than a subsequent voltage change and a variation that occurs when a collector current begins to flow becomes sharp. For this reason, a collector-to-emitter voltage that decreases as a function of the product of a time-dependent change of the collector current and parasitic inductance sharply varies and noise caused thereby has been substantial. As will be appreciated from the above, it has been difficult to achieve both a reduction in switching loss caused by high-speed switching and a reduction in noise.

The present invention has been made to overcome the aforementioned problem. Accordingly, it is an object of the invention to provide a gate driving circuit which makes it possible to suppress noise at turn-on while reducing switching loss caused by high-speed switching of a power semiconductor switching device.

Means for Solving the Problems

A gate driving circuit according to the present invention is for driving a voltage-driven power semiconductor switching device, the gate driving circuit including a gate resistor of which one end is connected to a gate terminal of the power semiconductor switching device, a DC voltage source for feeding a gate current into the gate terminal through the gate resistor, a switch connected between the other end of the gate resistor and the DC voltage source for controlling turn-on of the power semiconductor switching device, and a current limiting circuit for limiting the gate current. The current limiting circuit limits the gate current at turn-on of the power semiconductor switching device to a specific upper limit value.

Advantageous Effects of the Invention

According to the present invention, the gate current at turn-on of the power semiconductor switching device is limited to a specific upper limit value, so that a variation in a collector current becomes moderate when the same begins to flow, resulting in a reduction in high-frequency noise. This makes it possible to achieve a reduction in noise in high-speed, low-noise switching of the power semiconductor switching device.

MODES OF CARRYING OUT THE INVENTION

First Embodiment

A gate driving circuit according to a first embodiment of the present invention is now described below with reference to the drawings.

Figure 1:
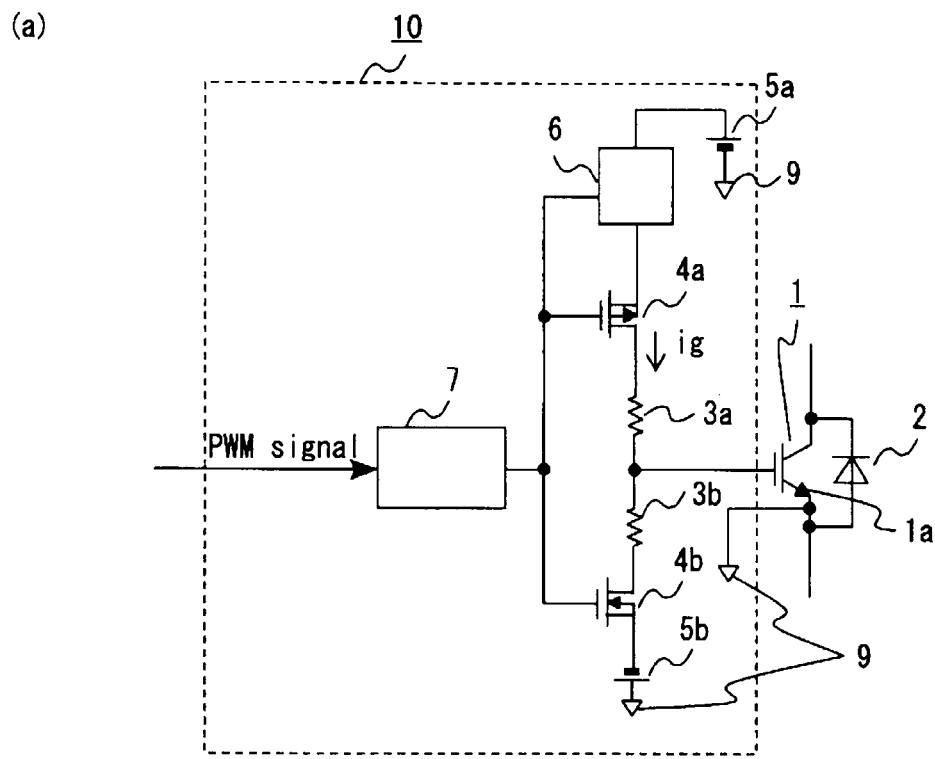
FIG. 1 is a diagram illustrating the configuration of a gate driving circuit according to a first embodiment of the present invention as well as the configuration of a switching circuit to which the gate driving circuit is applied.
Figure 1:
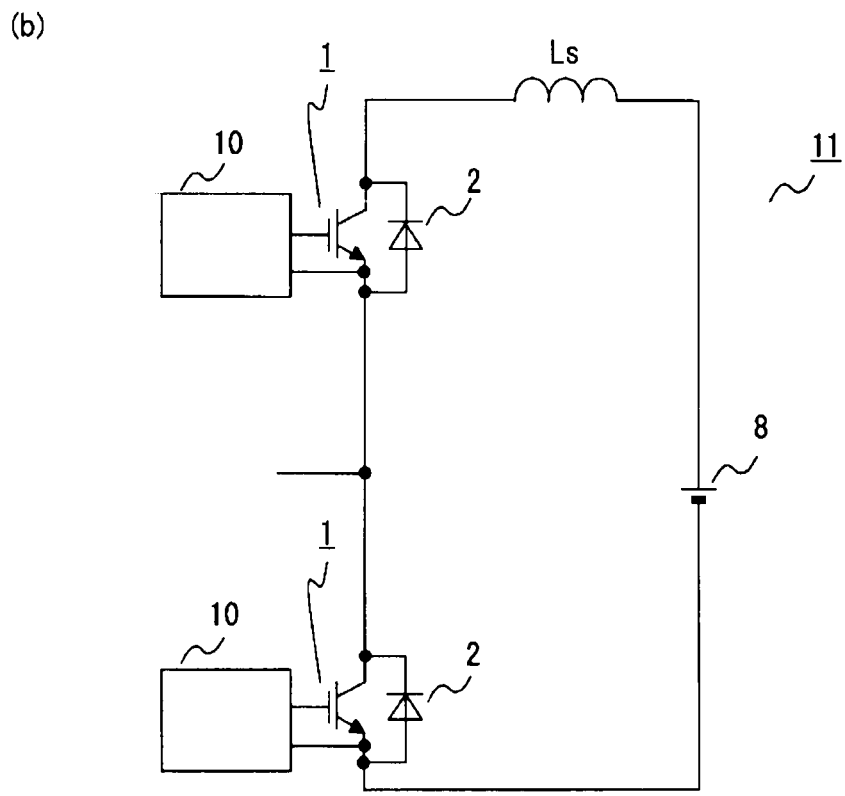

FIG. 1(a) is a diagram illustrating the configuration of the gate driving circuit according to the first embodiment of the invention and FIG. 1(b) illustrates the configuration of a half-bridge circuit shown as a basic form of a switching circuit which is configured with power semiconductor switching devices to which the gate driving circuit is applied.

Although IGBTs 1 made up of silicon (Si) semiconductors are used as voltage-driven power semiconductor switching devices driven by the gate driving circuits here, the power semiconductor switching devices are not limited to the IGBTs 1 but may be other voltage-driven power semiconductor switching devices like metal oxide semiconductor field effect transistors (MOSFETs). It is to be noted that each IGBT 1 is provided with a diode 2 which is connected in reverse parallel.

Figure 2:
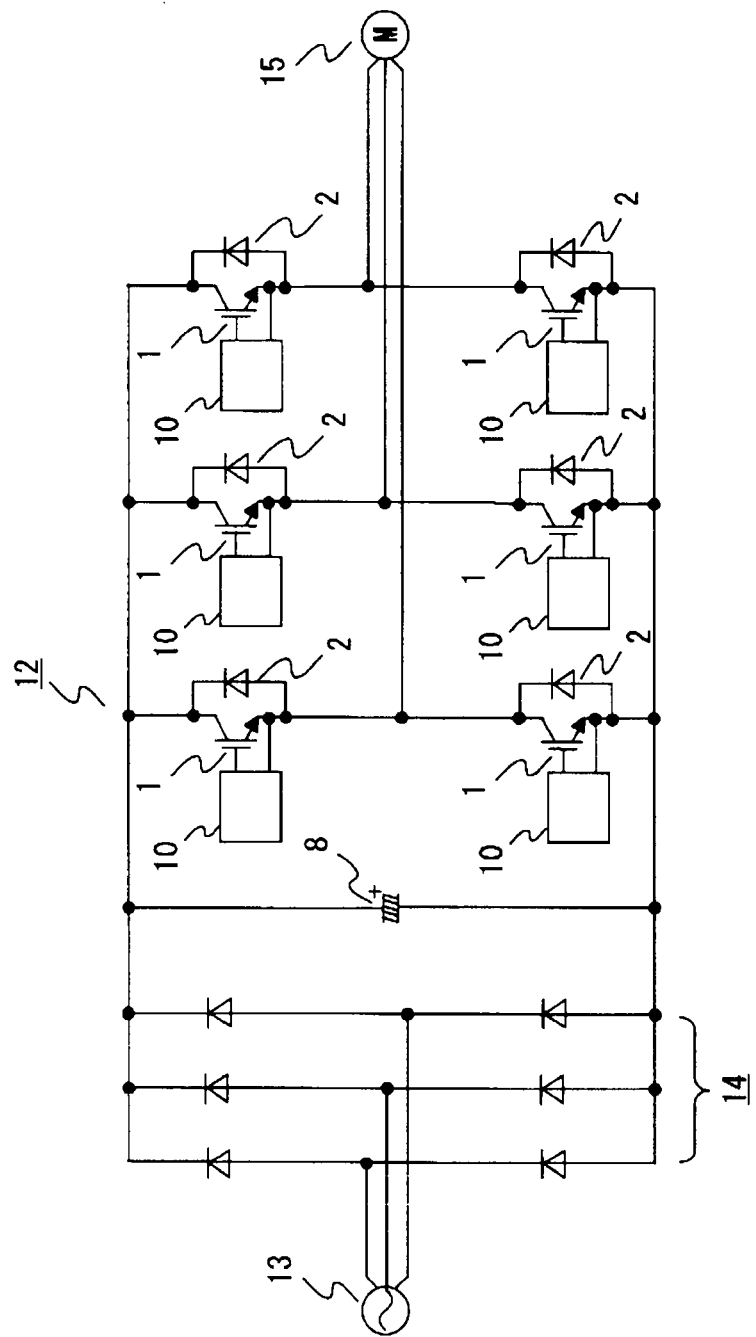
FIG. 2 is a circuit diagram illustrating a power converting system to which the gate driving circuit according to the present invention is applied.

The half-bridge circuit 11 shown in FIG. 1(b) includes a pair of combinations of one each IGBT 1, diode 2 and gate driving circuit 10 and a DC voltage source 8 and is illustrated as being associated with a parasitic inductance Ls which is present in a main circuit. It is possible to use such a half-bridge circuit 11 in various kinds of power converters. In a power converting system illustrated in FIG. 2, for example, the half-bridge circuit 11 constitutes a one-phase portion of a three-phase inverter circuit 12 which converts AC power fed from a system power supply 13 into AC power to be output to a load like a motor 15 after rectifying the input AC power by a rectification circuit 14.

As depicted in FIG. 1(a), the gate driving circuit 10 includes gate resistors 3a, 3b, one end of each gate resistor 3a, 3b being connected to a gate terminal of the IGBT 1, a MOSFET 4a which is a switch for controlling turn-on of the IGBT 1, a MOSFET 4b which is a switch for controlling turn-off of the IGBT 1, a DC voltage source 5a for applying a positive gate bias voltage to the gate terminal and a DC voltage source 5b for applying a negative gate bias voltage to the gate terminal. The gate driving circuit 10 further includes a current limiting circuit 6 for limiting a gate current ig at turn-on of the IGBT 1 as well as a control circuit 7 for outputting control signals to the MOSFETs 4a, 4b and the current limiting circuit 6 based on a switching command signal, such as a pulse width modulation (PWM) signal, input into the gate driving circuit 10. The MOSFET 4a and the current limiting circuit 6 are connected between the gate resistor 3a and the DC voltage source 5a in series therewith while the MOSFET 4b is connected between the gate resistor 3b and the DC voltage source 5b in series therewith.

It is to be noted that an emitter terminal 1a which constitutes a first main electrode of the IGBT 1 is connected to a reference potential terminal 9 of the gate driving circuit 10.

When turning on the IGBT 1 by the PWM signal, the MOSFET 4a is caused to turn on using the control signal fed from the control circuit 7 as an input signal, the gate current ig limited by the current limiting circuit 6 flows from the DC voltage source 5a into the gate terminal of the IGBT 1 through the gate resistor 3a to charge the gate terminal and, further, the gate current ig flows from the emitter terminal 1a of the IGBT 1 to the ground of the gate driving circuit 10.

Also, when turning off the IGBT 1, the MOSFET 4b is caused to turn on by the control signal from the control circuit 7 and the gate terminal of the IGBT 1 is discharged through the gate resistor 3b. The negative gate bias voltage is applied to the gate terminal of the IGBT 1 by the DC voltage source 5b to increase noise resistance of the IGBT 1.

Figure 3:
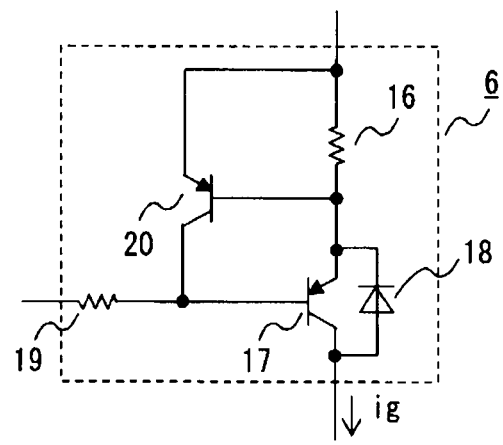
FIG. 3 is a diagram illustrating the configuration of a current limiting circuit according to the first embodiment of the present invention.

Illustrated in FIG. 3 is the configuration of an example of the current limiting circuit 6.

As depicted in the Figure, the current limiting circuit 6 includes a first pnp bipolar transistor 20, a resistor 16 connected between an emitter and a base of the first pnp bipolar transistor 20, a second pnp bipolar transistor 17 with which a diode 18 is connected in reverse parallel and a resistor 19. The emitter of the first pnp bipolar transistor 20 is connected to the DC voltage source 5a while an emitter, a base and a collector of the second pnp bipolar transistor 17 are connected to a joint between the base of the first pnp bipolar transistor 20 and the resistor 16, a collector of the first pnp bipolar transistor 20 and a gate resistor 3a (through the MOSFET 4a in this case), respectively. The control signal (voltage signal) from the control circuit 7 is then connected to the base of the second pnp bipolar transistor 17 so that the current limiting circuit 6 limits the gate current ig at turn-on to a specific upper limit value. The specific upper limit value defined by the current limiting circuit 6 is a value obtained by dividing a base-to-emitter voltage of the first pnp bipolar transistor 20 by the resistor 16 in this case.

If the control signal which is a low voltage signal is input from the control circuit 7 into the current limiting circuit 6 when the IGBT 1 turns on, a base current of the second pnp bipolar transistor 17 flows through the resistor 19. As a result, the second pnp bipolar transistor 17 goes into an electrically conductive state so that the gate current ig flowing into the gate terminal of the IGBT 1 flows through the resistor 16 and the second pnp bipolar transistor 17.

When the gate current ig increases and a voltage drop through the resistor 16 exceeds the base-to-emitter voltage of the first pnp bipolar transistor 20, the first pnp bipolar transistor 20 becomes conductive. As a consequence, the base and the emitter of the second pnp bipolar transistor 17 are short-circuited and the second pnp bipolar transistor 17 is cut off. As the above-described operation is executed in repetitive cycles, the gate current ig flowing through the current limiting circuit 6 is limited to the upper limit value which is the value obtained by dividing the base-to-emitter voltage of the first pnp bipolar transistor 20 by the resistor 16.

Figure 4:
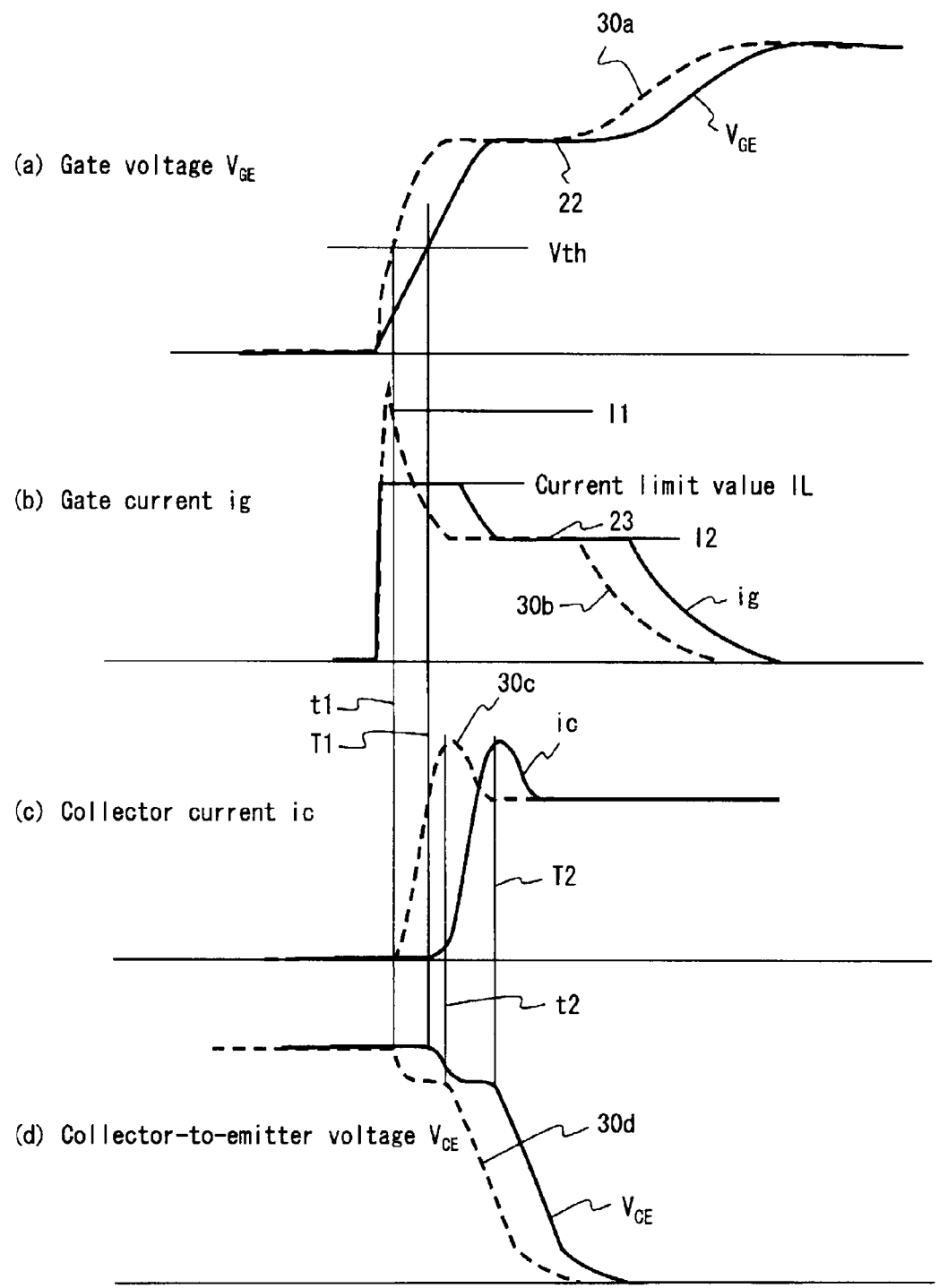
FIG. 4 is a waveform chart illustrating turn-on switching waveforms of an IGBT according to the first embodiment of the present invention together with a comparative example thereof.

Illustrated in FIG. 4 are turn-on switching waveforms of the IGBT 1 using the gate driving circuit 10 according to the present embodiment. FIG. 4(a) illustrates a gate voltage $V_{GE}$ which is a gate-to-emitter voltage, FIG. 4(b) illustrates the gate current ig, FIG. 4(c) illustrates a collector current is which is a main current and FIG. 4(d) illustrates a collector-to-emitter voltage $V_{CE}$. Also illustrated by broken lines 30a to 30d as a comparative example are waveforms which will be obtained in a case where there is not provided the current limiting circuit 6 and the gate current ig is not limited (this case is hereinafter referred to as comparative example 30). It is now assumed that this comparative example 30 is configured in the same fashion as the present embodiment except for the lack of the current limiting circuit 6.

Switching operation performed in comparative example 30 in which the gate voltage is not limited is explained at first with reference to the individual waveforms of the gate voltage 30a, the gate current 30b, the collector current 30c and the collector-to-emitter voltage 30d depicted in FIG. 4.

At a point of turn-on when the gate terminal of the IGBT 1 is charged from the DC voltage source 5a through the gate resistor 3a in comparative example 30, a large gate current flows in the beginning, causing the gate voltage to sharply increase. When the gate voltage reaches a gate threshold voltage Vth at time t1, the collector current begins to flow and the collector-to-emitter voltage begins to drop. As the gate voltage increases subsequently, the gate current decreases and the increase in the gate voltage becomes moderate. Then, the gate voltage remains constant for a specific period of time owing to the Miller effect.

At time t1, the collector current varies sharply when the same begins to flow and, at this time, the collector-to-emitter voltage which decreases as a function of the product of a time-dependent change of the collector current and the parasitic inductance Ls sharply varies as well. The value of the gate current at this point in time is referred to as a first gate current value I1. Subsequently, at time t2, a point in time when it becomes impossible for the IGBT 1 to maintain the collector-to-emitter voltage overlaps a peak of a recovery current of the diode 2 which is connected to the IGBT 1 in reverse parallel therewith and the value of the collector current also reaches a peak thereof.

Next, switching operation performed by using the gate driving circuit 10 according to the present embodiment is explained. In this case, the gate current ig is limited to a current limit value IL which is the specific upper limit value by the current limiting circuit 6.

At the time of turn-on when the gate terminal of the IGBT 1 is charged from the DC voltage source 5a through the gate resistor 3a, the gate current ig is limited to the current limit value IL from the beginning of flowing of the gate current ig and the gate current ig which is a constant current having the current limit value IL flows for a specific period of time. The gate voltage $V_{GE}$ increases in proportion to time. When the gate voltage $V_{GE}$ reaches the gate threshold voltage Vth at time T1, the collector current is begins to flow and the collector-to-emitter voltage $V_{CE}$ begins to drop.

Figure 5:
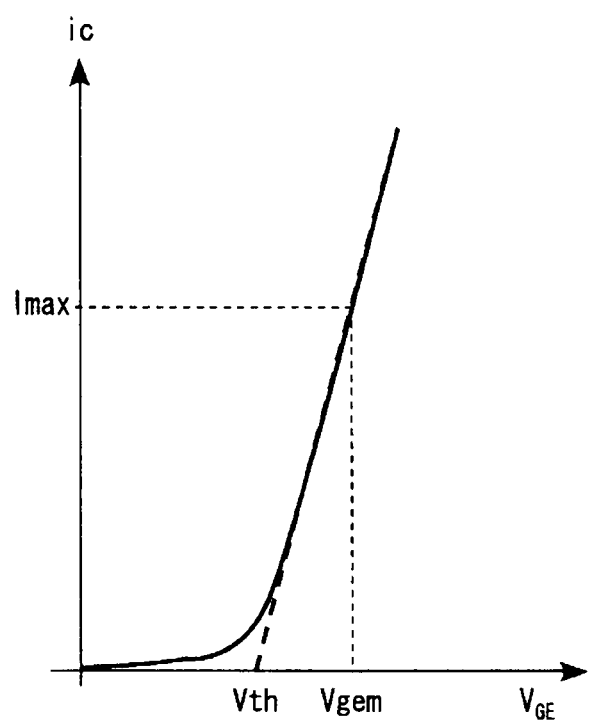
FIG. 5 is a characteristic diagram illustrating a transfer characteristic of the IGBT.

The collector current is that flows in the IGBT 1 is determined by the gate voltage $V_{GE}$ and a transfer characteristic (gate voltage/collector current characteristic) depicted in FIG. 5. In this case, a change in the gate voltage $V_{GE}$ at around time T1, or at around the gate threshold voltage Vth, becomes more moderate than in comparative example 30 and, therefore, a change at a portion where the collector current ic begins to flow also becomes moderate.

Subsequently, at time T2, a point in time when it becomes impossible for the IGBT 1 to maintain the collector-to-emitter voltage $V_{CE}$ overlaps a peak of a recovery current of the diode 2 which is connected to the IGBT 1 in reverse parallel therewith and the value of the collector current ic also reaches a peak thereof. Also, the gate current ig decreases and, then, the gate voltage $V_{GE}$ becomes constant and the gate current ig also becomes constant at a second gate current value I2 for specific periods of time (Miller periods 22, 23) owing to the Miller effect. Subsequently, voltages and currents at individual parts vary as depicted in the Figure and the IGBT 1 goes into an electrically conductive state.

Since the change at the portion where the collector current ic begins to flow becomes moderate at around time T1 in the present embodiment, the collector-to-emitter voltage $V_{CE}$ which decreases as a function of the product of the time-dependent change of the collector current ic and the parasitic inductance Ls also varies in a moderate fashion.

Next, a relationship between the voltage waveform of the collector-to-emitter voltage and noise is explained.

Figure 6:
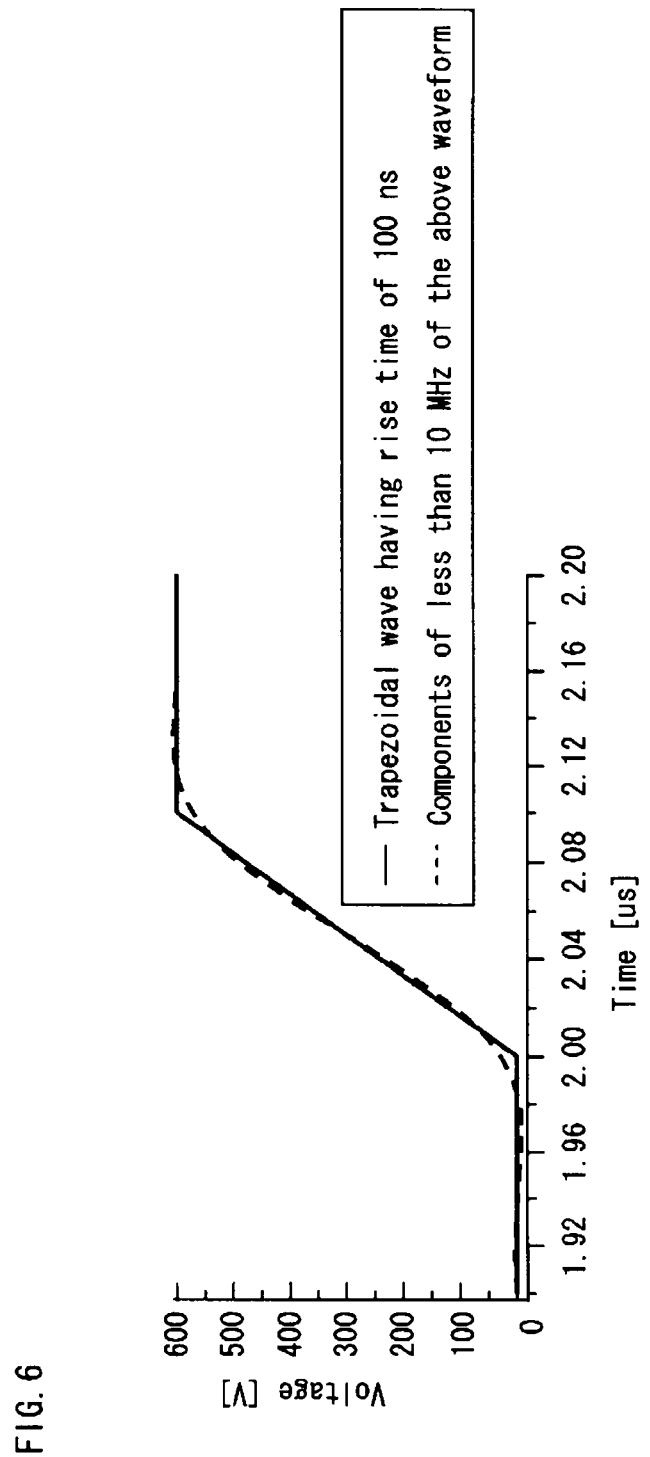
FIG. 6 is a diagram illustrating a voltage waveform formed by a trapezoidal wave and a voltage waveform containing no high-frequency components.

FIG. 6 is a diagram illustrating a voltage waveform (solid line) formed by a trapezoidal wave and a voltage waveform (broken line) containing no high-frequency components. Illustrated here are the voltage waveform formed by the trapezoidal wave where the collector-to-emitter voltage rises in about 100 ns as a result of switching of the IGBT as well as the voltage waveform formed by components of less than 10 MHz of the trapezoidal wave alone. Although the waveform scarcely varies during a halfway period when the voltage waveform rises, that is when the voltage is approximately 300 V, for instance, there is a significant difference between the beginning of a voltage rise and the ending of the voltage rise. High-frequency components which act as noise are contained mostly in portions where the waveform rapidly varies, such as in portions of the beginning and ending of the voltage rise as mentioned above. Also, there is almost no difference in switching loss between the waveform formed by the trapezoidal wave and the waveform formed by the components of less than 10 MHz. It is understood that the high-frequency noise can be reduced despite the fact that there is almost no difference in switching loss if it is possible to make rising and falling portions moderate as mentioned above.

While the aforementioned example has depicted a case where the voltage rises, noise components of a few tens of MHz and above are known to concentrate in portions where there is a large variation with time in the waveform, such as at an instant when the voltage begins to rise or fall.

As discussed in the foregoing, the gate current ig is limited at turn-on in order that a change in current at the portion where the collector current is begins to flow becomes moderate, causing the collector-to-emitter voltage $V_{CE}$ to vary moderately in the present embodiment. For this reason, it is possible to decrease high-frequency noise components which used to occur in the relevant portion in a concentrated fashion.

Since noise components equivalent to those which occur in comparative example 30 are produced in other portions, it is possible to reduce noise as a whole and achieve low-noise performance at turn-on without increasing the switching loss. Since noise which may exert adverse effects on other apparatuses as a result of conduction through electrical wirings or radiation from an apparatus is reduced as discussed above, reliability of power converting apparatuses using IGBTs is increased.

Additionally, it is not necessary to monitor a collector voltage and a gate voltage and switch the gate voltage and the gate current so that it is possible to achieve the aforementioned advantage with the gate driving circuit 6 having a simple circuit configuration. For this reason, it becomes possible to perform faster switching operation.

Also, even in a second comparative example in which the IGBT 1 is driven with the gate current held at a constant current, it is possible to cause the collector-to-emitter voltage to vary in a moderate fashion by making a change in current at portions where the collector current begins to flow (times t1, T1) moderate. In this second comparative example, however, a change in the gate-to-emitter voltage at around the peak of the collector current (times t2, T2) is larger than in comparative example 30 and the foregoing first embodiment and, therefore, a change in the collector current becomes sharp and noise components in this portion increases in a manner opposite to expectations, making it impossible as a whole to achieve a noise-reducing effect unlike the case of the first embodiment.

The current limit value IL of the current limiting circuit 6 is set at a value larger than the gate current value (second gate current value I2) during the Miller period 23 when the Miller effect occurs at turn-on but smaller than the gate current value (first gate current value I1) at a point in time when the collector current begins to flow in comparative example 30 in which the gate current is not limited by the current limiting circuit 6. The second gate current value I2 during the Miller period 23 is determined in the following manner. When the collector current of the IGBT 1 is determined, the gate voltage during each of the Miller periods 22, 23 is determined by the transfer characteristic depicted in FIG. 5. A differential voltage between the DC voltage source 5a of the gate driving circuit 6 and the gate voltage during the Miller period is applied to the gate resistor 3a and the gate current during each of the Miller periods 22, 23 (second gate current value I2) is determined.

If the current limit value IL is larger than the first gate current value I1, a change in the gate voltage when the gate voltage reaches the gate threshold voltage Vth is the same as in the case of comparative example 30 so that no noise-reducing effect is obtained. Also, if the current limit value IL is smaller than the second gate current value I2, switching time increases, resulting in an increase in the switching loss. While the second gate current value I2 during each of the Miller periods 22, 23 varies with the collector current, the second gate current value I2 is set at a collector current value at which it is desired to decrease high-frequency noise.

Also, the second gate current value I2 during the Miller period 23 may be determined in the following fashion. Expressing a maximum value of the collector current flowing in the IGBT 1 by Imax, the gate voltage determined by the gate voltage/collector current characteristic (refer to FIG. 5) at that time by Vgem, the value of the voltage of the DC voltage source 5a by Vcc and the value of the resistance of the gate resistor 3a by Rg, which are determined by the specifications of an apparatus using IGBT1, the gate current during the Miller period 23 (second gate current value I2) is given by (Vcc−Vgem)/Rg. In this case, the current limit value IL of the current limiting circuit 6 is set at a value larger than (Vcc−Vgem)/Rg but smaller than the aforementioned first gate current value I1.

Second Embodiment

Next, a gate driving circuit 10a according to a second embodiment of the present invention is described with reference to FIG. 7.

Figure 7:
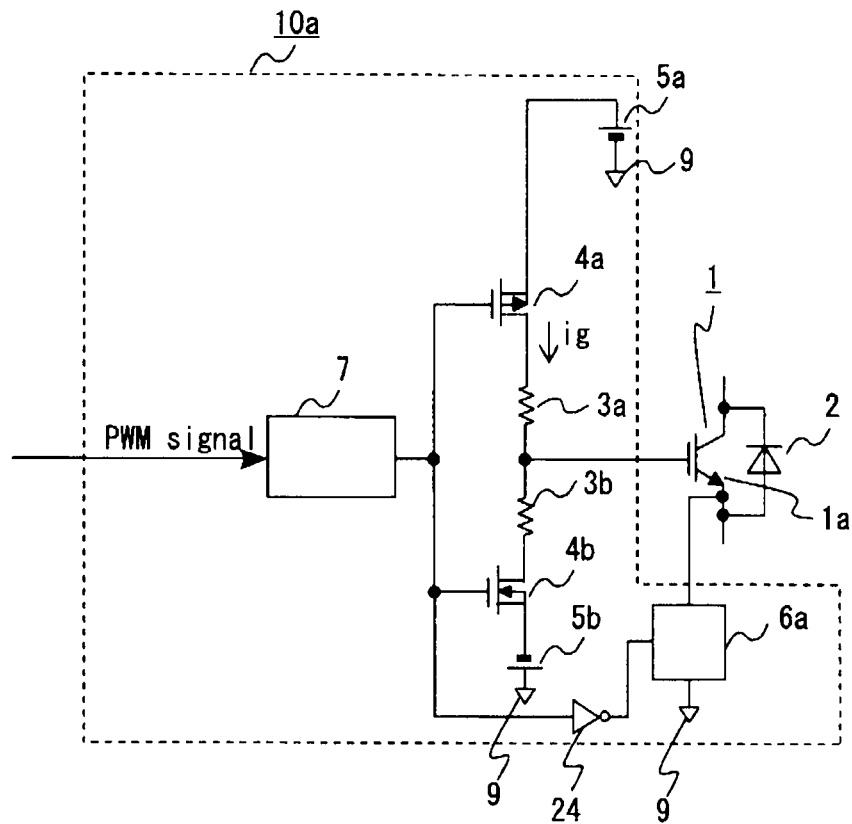
FIG. 7 is a diagram illustrating the configuration of a gate driving circuit according to a second embodiment of the present invention.

While the current limiting circuit 6 is connected between the gate resistor 3a and the DC voltage source 5a in series therewith in the foregoing first embodiment, a current limiting circuit 6a is connected between an emitter terminal 1a of an IGBT 1 and a reference potential terminal 9 of the gate driving circuit 10a in series therewith in the second embodiment as illustrated in FIG. 7. In this case, a control signal fed from a control circuit 7 is inverted by a NOT circuit 24 and input into the current limiting circuit 6a. It is to be noted that portions other than the current limiting circuit 6a and the NOT circuit 24 are the same as in the above-described first embodiment.

In the present embodiment, when the IGBT 1 is turned on by the gate driving circuit 10a, the gate current ig flows from the DC voltage source 5a through the MOSFET 4a, the gate resistor 3a, the gate terminal of the IGBT 1, the emitter terminal 1a of the IGBT 1 and the current limiting circuit 6a in this order and then flows to the ground of the gate driving circuit 10a.

Figure 8:
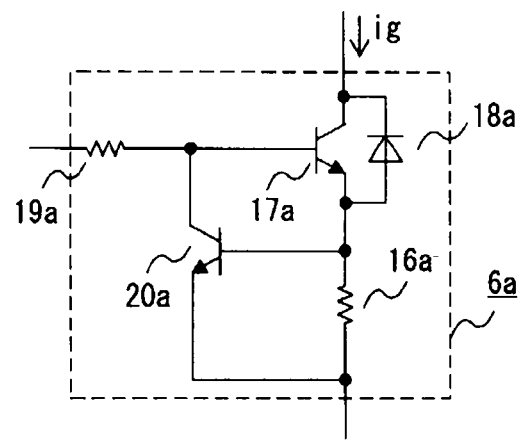
FIG. 8 is a diagram illustrating the configuration of a current limiting circuit according to the second embodiment of the present invention.

Illustrated in FIG. 8 is the configuration of an example of the current limiting circuit 6a.

As depicted in the Figure, the current limiting circuit 6a includes a first npn bipolar transistor 20a, a resistor 16a connected between an emitter and a base of the first npn bipolar transistor 20a, a second npn bipolar transistor 17a with which a diode 18a is connected in reverse parallel and a resistor 19a. The emitter of the first npn bipolar transistor 20a is connected to the reference potential terminal 9 of the gate driving circuit 10a while an emitter, a base and a collector of the second npn bipolar transistor 17a are connected to a joint between the base of the first npn bipolar transistor 20a and the resistor 16a, a collector of the first npn bipolar transistor 20a and the emitter terminal 1a of the IGBT 1, respectively.

The control signal (voltage signal) from the control circuit 7 is then inverted by the NOT circuit 24 and connected to the base of the second npn bipolar transistor 17a so that the current limiting circuit 6a limits the gate current ig at turn-on to the current limit value IL which is a specific upper limit value. In this case, the current limit value IL is a value obtained by dividing a base-to-emitter voltage of the first npn bipolar transistor 20a by the resistor 16a.

It is also the case in this embodiment that the current limit value IL of the current limiting circuit 6a is set at a value larger than the gate current value (second gate current value I2) during the Miller period 23 when the Miller effect occurs at turn-on but smaller than the gate current value (first gate current value I1) at a point in time when the collector current begins to flow in comparative example 30 in which the gate current is not limited by the current limiting circuit 6a.

This enables the same switching operation as performed in the foregoing first embodiment. Specifically, a change in current at the portion where the collector current is begins to flow is made moderate, causing the collector-to-emitter voltage $V_{CE}$ to vary moderately in the present embodiment. For this reason, it is possible to decrease the high-frequency noise components which used to occur in the relevant portion in a concentrated fashion and, thus, the same advantageous effect is obtained as in the foregoing first embodiment.

While the individual embodiments thus far discussed have presented the gate driving circuits employing the power semiconductor switching devices made of a Si semiconductor, the power semiconductor switching devices may be of a type made of a non-Si semiconductor material having a wider band gap than the Si semiconductor. Wide-band-gap semiconductors that are non-Si semiconductor materials include silicon carbide, a gallium nitride material and diamond, for example.

Power semiconductor switching devices made of a wide-band-gap semiconductor are usable in a high-voltage region in which it is difficult for the Si semiconductor to perform unipolar operation and these switching devices make it possible to greatly reduce switching loss that occurs at switching as well as power loss. Also, the power semiconductor switching devices made of a wide-band-gap semiconductor produce small power loss and have a high heat-resistant property. Thus, if a power module is configured to include a cooling unit, using such switching devices, it is possible to reduce the size of radiator fins of a heat sink and redesign a water-cooled unit into an air-cooled system and, therefore, the semiconductor module can be made even more compact. Additionally, power semiconductor switching devices made of a wide-band-gap semiconductor are suited to high-frequency switching operation. Therefore, if these switching devices are applied to a DC/DC converter which is greatly required to work at a higher frequency, it is possible to reduce the sizes of a reactor and a capacitor which are connected to the DC/DC converter owing to an increase in a carrier frequency used in the operation of the DC/DC converter.

The invention claimed is:

1. A gate driving circuit for driving a voltage-driven power semiconductor switching device, said gate driving circuit comprising:

a gate resistor including a first end connected to a gate terminal of said power semiconductor switching device;

a DC voltage source to feed a gate current to the gate terminal through said gate resistor;

a switch connected between a second end of said gate resistor and said DC voltage source to control turn-on of said power semiconductor switching device; and a current limiting circuit to limit the gate current, wherein said current limiting circuit is provided in a path of the gate current and limits the gate current at turn-on of said power semiconductor switching device to a predefined upper limit value, the gate driving circuit is configured to supply to the current limiting circuit a voltage signal based on a control signal supplied to said switch, and an input terminal of said current limiting circuit that receives the voltage signal is coupled to a control terminal of said switch that receives the control signal.

2. The gate driving circuit as recited in claim 1, wherein the predefined upper limit value of said current limiting circuit is set at a value which is larger than a first gate current value at turn-on of said power semiconductor switching device during a period when the Miller effect occurs, and which is smaller than a second gate current value at a point in time when a main current of said power semiconductor switching device begins to flow at turn-on in a case where the gate current is not limited by said current limiting circuit.

3. The gate driving circuit as recited in claim 1, wherein said current limiting circuit is connected between said DC voltage source and said gate resistor, in series therewith, said current limiting circuit including:

a first pnp bipolar transistor having an emitter connected to said DC voltage source;

a resistor connected between the emitter and a base of said first pnp bipolar transistor; and a second pnp bipolar transistor having an emitter connected to the base of said first pnp bipolar transistor and said resistor, a base to receive said voltage signal and connected to a collector of said first pnp bipolar transistor, and a collector connected to said gate resistor.

4. The gate driving circuit as recited in claim 1, wherein said current limiting circuit is connected between a first main electrode of said power semiconductor switching device and a reference potential terminal of said gate driving circuit, in series therewith, said current limiting circuit including:

a first npn bipolar transistor having an emitter connected to said reference potential terminal;

a resistor connected between the emitter and a base of said first npn bipolar transistor; and a second npn bipolar transistor having an emitter connected to the base of said first npn bipolar transistor and said resistor, a base to receive said voltage signal and connected to a collector of said first npn bipolar transistor, and a collector connected to the first main electrode of said power semiconductor switching device.

5. The gate driving circuit as recited in claim 1, wherein said power semiconductor switching device is made of a non-Si semiconductor material having a wider band gap than a band gap of silicon.

6. The gate driving circuit as recited in claim 5, wherein the non-Si semiconductor material is one of silicon carbide, a gallium nitride material and diamond.

\* \* \* \* \*